United States Patent
Paul et al.

(10) Patent No.: US 8,104,004 B2
(45) Date of Patent: Jan. 24, 2012

(54) LOGIC PERFORMANCE IN CYCLIC STRUCTURES

(75) Inventors: Gael Paul, Aix-en-Provence (FR); Denny Scharf, San Jose, CA (US); Rajit Manohar, Ithaca, NY (US)

(73) Assignee: Achronix Semiconductor Corporation, Santa Clara, CA (US)

( * ) Notice: Subject to any disclaimer, the term of this patent is extended or adjusted under 35 U.S.C. 154(b) by 1016 days.

(21) Appl. No.: 12/030,531

(22) Filed: Feb. 13, 2008

(65) Prior Publication Data

US 2009/0201044 A1 Aug. 13, 2009

(51) Int. Cl.
*G06F 17/50* (2006.01)

(52) U.S. Cl. .................................. 716/108; 716/100

(58) Field of Classification Search ............... 716/100, 716/108
See application file for complete search history.

(56) References Cited

U.S. PATENT DOCUMENTS

| | | | | |
|---|---|---|---|---|
| 4,998,246 A | * | 3/1991 | Tanaka | 370/452 |
| 5,068,849 A | * | 11/1991 | Tanaka | 370/509 |
| 5,671,151 A | * | 9/1997 | Williams | 716/113 |
| 6,081,656 A | | 6/2000 | Witt | |
| 6,618,835 B1 | * | 9/2003 | Garlapati et al. | 716/104 |
| 6,658,635 B1 | * | 12/2003 | Tanimoto | 716/108 |
| 2006/0076989 A1 | * | 4/2006 | Culmer | 327/156 |
| 2006/0123300 A1 | * | 6/2006 | Gupta et al. | 714/741 |
| 2007/0234267 A1 | | 10/2007 | Kakui | |
| 2008/0228951 A1 | * | 9/2008 | Chow et al. | 710/10 |
| 2009/0044157 A1 | * | 2/2009 | Gupta et al. | 716/3 |

OTHER PUBLICATIONS

"International application serial No. PCT/US2009/033079 Search Report mailed Jul. 6, 2009", 12 pgs.
"International application serial No. PCT/US2009/033079 Written Opinion mailed Jul. 6, 2009", 12 pgs.

* cited by examiner

*Primary Examiner* — Suchin Parihar
(74) *Attorney, Agent, or Firm* — Schwegman, Lundberg & Woessner, P.A.

(57) ABSTRACT

Apparatus, systems, and methods may operate to identify state holding elements and functional logic elements in an original cyclic structure, and to insert additional state holding elements or initial tokens in series with the identified functional logic elements to create a modified cyclic structure, wherein the additional state holding elements or initial tokens have substantially identical functionality to the original state holding elements. Other activities may include coupling additional functional logic elements to output nodes of the modified cyclic structure, wherein the additional functional logic elements have substantially identical functionality to the original functional logic elements. Additional apparatus, systems, and methods are disclosed.

29 Claims, 6 Drawing Sheets

LOGIC PERFORMANCE IN CYCLIC STRUCTURES

BACKGROUND

Circuits generally operate in two fundamental frequency modes, synchronous and asynchronous. A synchronous circuit is a digital circuit in which the various circuit components are synchronized by a centrally generated clock signal. In an ideal synchronous circuit, every change in the logical levels of each storage component is simultaneous. These transitions follow the level change of the clock. Ideally, the input to each storage element has reached its final value before the next clock occurs, so the behavior of the whole circuit can be accurately predicted. Practically, some delay ensues with each logical operation, resulting in a maximum speed at which each synchronous system can run. For these circuits to work correctly, a great deal of care is taken in the design of the clock distribution networks. Static timing analysis is often used to determine a useful upper limit on the operating speed.

As a matter of contrast, an asynchronous circuit is a circuit in which the circuit components operate largely autonomously. The circuit components are not governed by a clock circuit or global clock signal, but instead operate based upon signals that indicate completion of previous instructions and operations. These signals are specified by simple data transfer protocols.

It is well known that cyclic structures in both synchronous and asynchronous logic implementations can limit system performance. A cyclic structure may be generally defined as a feedback path including at least one state control element. There are a variety of known techniques to optimize the performance of synchronous and asynchronous logic in the presence of such cyclic structures. In the asynchronous case, optimization is most often carried out using a method known as slack-matching, which operates by inserting additional buffer stages in a cyclic structure to improve its throughput. In the synchronous case, optimization is most often carried out using a method referred to as re-timing or time-borrowing, where state-holding elements like latches or registers are either virtually or physically moved to different locations in the cycle to balance paths and optimize system performance.

BRIEF DESCRIPTION OF THE DRAWINGS

The features and advantages of various embodiments of the invention will be apparent from a consideration of the following Detailed Description in conjunction with the drawing Figures, in which.

DETAILED DESCRIPTION

Figure 1:
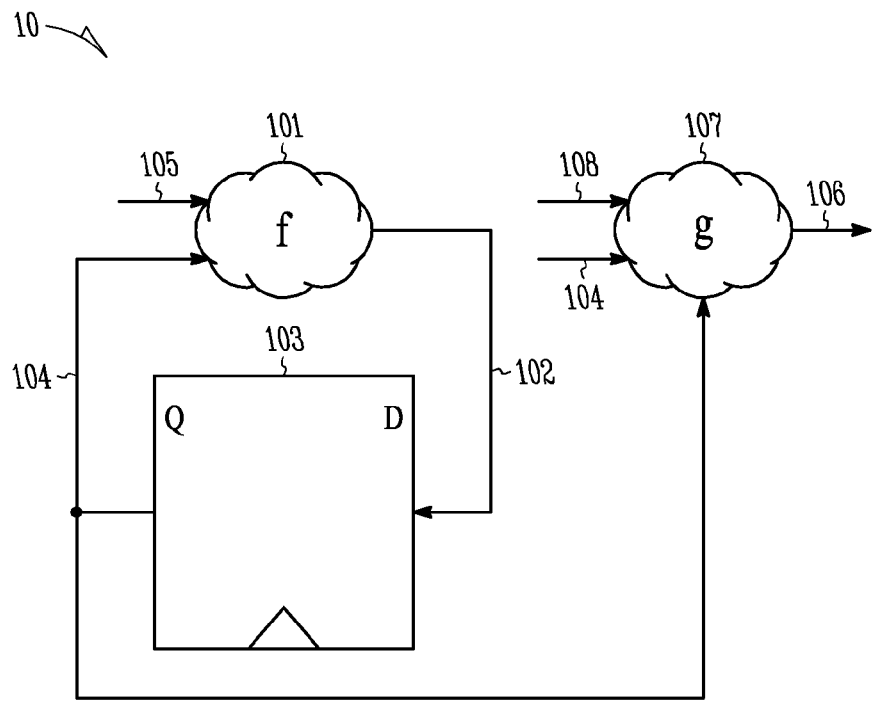
FIG. 1 is an illustration of a combinational logic circuit of the prior art based on a cyclic structure.

As noted previously, system throughput may be limited by cyclic structures associated with synchronous and asynchronous circuits. For example, in a synchronous design, the delay of the combinational logic in a cyclic path divided by the total number of registers on the path provides a fundamental limit to system performance. In an asynchronous design, the latency of the logic on a cyclic path divided by the number of data tokens on the cyclic path provides another limit to system performance. While some techniques may serve to improve the performance of synchronous and asynchronous logic in the presence of cyclic structures, the degree of improvement can be limited as the size of the structure increases.

For example, slack-matching can improve the performance of a cyclic structure by inserting buffer stages. However, if the structure already has many stages, then inserting buffers can actually reduce the performance of the cyclic structure. In the synchronous domain, re-timing also only improves the performance to a point. If the latches/registers in the cyclic structure are already balanced, then re-timing may provide no improvement in performance. In such cases, the performance of the system is sometimes improved by the introduction of additional state control elements in the cyclic structure. However, this improvement may come at the expense of an undesirable change in circuit functionality. Therefore, the need exists to improve system performance in synchronous and asynchronous logic used in conjunction with cyclic structures without causing unintended changes in circuit functionality.

The embodiments disclosed may serve to address the foregoing challenges, among others, by providing apparatus, systems, and methods for improving the performance of synchronous and asynchronous logic in the presence of cyclic structures. Essentially, logic in cyclic structures can be modified as described herein so as to improve overall logic system performance in a more dependable fashion.

At least one embodiment of the invention involves a method to modify the logic of a circuit design, in which the logic of a cyclic portion of the circuit is restructured and retimed for clock period minimization. In some cases, the undesired consequences of performing such restructuring and retiming, such as an unintended change in circuit functionality, may be compensated for (i.e., corrected) through the addition of functional logic outside of the cyclic portion of the circuit.

To correct for an undesired change in circuit functionality, the inventors have recognized that the functionality of the logic placed outside of the cyclic portion to achieve compensation should be equivalent to the functionality of the logic inside of the original cyclic structure. In other words, by duplicating or replicating the functional logic outside of the cyclic structure, effective compensation can be realized. The inventors have further recognized that an improvement in system performance may also be realized by re-timing the added functional logic placed outside of the cyclic structure.

Any of the disclosed methods can be performed using software stored on a computer-readable medium and executed on a computer. Such software can comprise, for example, an electronic-design-automation (EDA) software tool used, for instance, for logical or physical circuit synthesis. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in detail.

The disclosed methods can be used at one or more stages of an overall synthesis scheme. For example, the retiming procedure(s) can be utilized to improve the design after logical synthesis. The retiming procedure(s) can also be used after placement and routing is performed in order to improve the implemented design. At this stage, additional physical information, such as interconnect delay, is typically available so that delay times can be more accurately computed.

FIG. 1 is an illustration of a combinational logic circuit 10 of the prior art based on a cyclic structure. Combinational logic circuit 10 includes combinational logic 101 that implements a function "$f$" (e.g., an adder, subtractor, multiplier, or some other combinational logic function), combinational logic 107 that implements a function "g", and register 103. It is understood that in this document, a register refers to a sequential element in general (e.g., a delay element, a memory cell, a flip-flop, or others). A register can operate to sample and hold (store) an input signal for output at a later time, in synchronization with the clock of the circuit.

As illustrated in FIG. 1, combinational logic 101 generates an output 102 that is electrically connected to the input of register 103. The output of the register 103 is fed back into the input of the combinational logic 101, thereby creating a cyclic structure. Combinational logic 101 also includes an external input 105 that may be sourced from another part of the system. The signal 104 is combined with other signals 108 by combinational logic 107 to produce a final output 106.

A drawback of the prior art circuit 10 of FIG. 1 is that if the delay through combinational logic 101 is very large, then the throughput of the overall system will be limited because there is only one register 103 on the cyclic path starting with combinational logic 101, signal 102, register 103 and terminating back at input 104. If there were multiple registers present along the cyclic path, these registers could be distributed through the combinational logic 101 to balance the delays and improve throughput.

Figure 2:
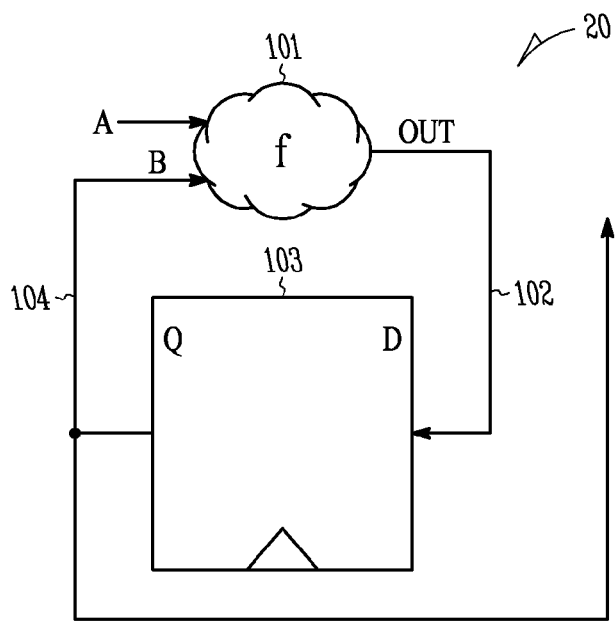
FIG. 2 is an illustration of the cyclic structure portion of the prior art combinational logic circuit of FIG. 1, which contributes to the performance limitations of the logic circuit.

FIG. 2 is an illustration of the cyclic structure portion 20 of the prior art combinational logic circuit 10 of FIG. 1, which contributes to the performance limitations of the logic circuit 10, as discussed in the preceding paragraphs. The behavior of the output of the cyclic structure portion 20 of FIG. 2 will be described on a per-cycle basis, utilizing the notation OUT[k] as the logic circuit output value 102 at the $k^{th}$ cycle. In light of this adopted notation, the following relationships may be derived:

$$OUT[k] = f(A[k], B[k]) \quad \text{Eq. [1]}$$
$$= f(A[k], f(A[k-1], A[k-1]))$$
$$= f(A[k], f(A[k-1], f(A[k-2] \cdot B[k-2])))$$
$$= f(A[k], f(A[k-1], f(A[k-2] \ldots ,$$
$$f(A[1], f(A[0], B[0])) \ldots )))$$

where the value of B[0] is determined by the reset condition of state-holding element 103, and $$B[k+1]=OUT[k] \quad \text{Eq. [2]}$$

Equations [1] and [2] are implied by the logic of the cyclic structure portion 20. Equation [1] describes the combinational logic 101. In other words, the combinational logic 101 computes a function f in two variables, i.e., inputs A and B. The second equation B[k+1]=OUT[k] describes the behavior of register 103.

Now it will be demonstrated that, by restructuring the logic of the cyclic structure portion 20, system performance can be improved without changing the functionality of the circuit (i.e., without changing OUT[k] of Equation [1]).

Figure 3:
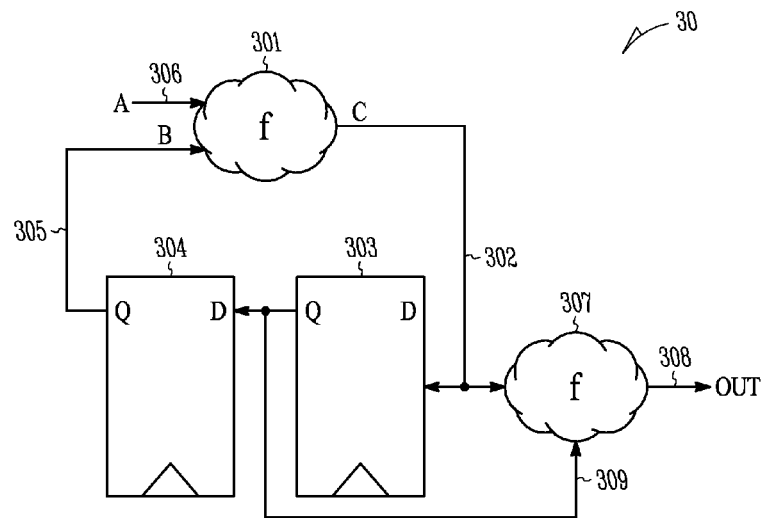
FIG. 3 is an illustration of a cyclic structure of FIG. 2, modified according to various embodiments of the invention.

FIG. 3 is an illustration of a cyclic structure of FIG. 2, modified according to various embodiments of the invention. FIG. 3 illustrates a logic circuit 30 that includes combinational logic 301 that implements function "$f$", register 303, register 304, and combinational logic 307 that implements the identical function "$f$". Combinational logic 301 generates an output signal 302, which is electrically connected to an input of register 303, that is in turn sequentially connected to register 304. The output of flip-flop 304 is connected to one input of combinational logic 301, labeled B. Combinational logic 301 also receives an external input, labeled A. Combinational logic 307 generates a single output, labeled OUT. As shown, combinational logic 307 is sourced from two inputs. A first input, corresponding to the output of combinational logic 302, labeled C, and a second input 309 corresponding to the output of flip-flop 303.

The logic circuit 30 of FIG. 3 represents an improved cyclic structure of the logic circuit of FIG. 2 based on restructured logic. More particularly, the logic circuit 30 of FIG. 3 differs from the logic circuit of FIG. 2 in two major aspects. In a first aspect, the logic circuit of FIG. 3 is shown to include two registers 303, 304 in the cyclic structure portion of the logic circuit, while FIG. 2 includes only one register 103 in the cyclic structure portion of the logic circuit 20. In a second aspect, the logic circuit of FIG. 3 includes two identical copies of the function "$f$", as implemented by combinational logic blocks 301 and 307, respectively, while only a single copy of the function "$f$" is implemented by combinational logic block 101 in the logic circuit of FIG. 2.

Re-structuring the logic circuitry, coupled with certain re-timing procedures to be performed on the re-structured logic, as described below with reference to FIG. 3, result in improved system performance in both synchronous and asynchronous logic circuits. While a synchronous logic circuit is shown by way of example, the general principles of logic restructuring and re-timing described herein, apply with equal force to asynchronous logic circuits.

Using the notation set forth above, the following relationships may be derived for the improved logic circuit 30 of FIG. 3:

$$C[k]=f(A[k],B[k]) \quad \text{Eq. [3]}$$

where Eq. [3] is the output of combinational logic block 301, and $$B[k+2]=C[k] \quad \text{Eq. [4]}$$

where Eq. [4] describes the behavior of registers 303 and 304, and $$OUT[k]=f(C[k],C[k-1]) \quad \text{Eq. [5]}$$

Equations [3] through [5] are implied by the logic of improved logic circuit 30 and further imply the following relationships.

$$C[2k]=f(A[2k],f(A[2k-2],f(A[2k-4]\ldots,$$
$$f(A[2],f(A[0],B[0]))\ldots)) \quad \text{Eq. [6]}$$

$$C[2k+1]=f(A[2k+1],f(A[2k-1],f(A[2k-3]\ldots,$$
$$f(A[3],f(A[1],B[1]))\ldots)) \quad \text{Eq. [7]}$$

The values of B[0] and B[1] in equations [6] and [7], respectively, are determined by the initial values of flip-flops or registers 304 and 303, respectively.

If the function f(A,B) of combinational logic 301 has a right identity, i.e., there exists some value "BI" such that f(X,BI)=X for all values of X, and we initialize B[1] to be the right identity of operation "f", then the expression f(A[1],B[1]) simplifies to A[1].

The assumptions of associativity and commutativity are not necessarily true for an arbitrary function "f". For example, the function "f(a,b)=a AND NOT b" is not commutative because f(1,0)=1 but f(0,1)=0. However, many common functions used for complex arithmetic calculations are both associative and commutative. For example, the function "f(a,b)= a+b" is an associative and commutative function. If we assume that function f(A,B) is both associative and commutative, then the output OUT[k] of equation [5] is equal to the expression for OUT[k] from equation [1].

It can be reasonably concluded from the equivalence of equations [1] and [5] above that both the logic circuits of FIGS. 2 and 3 describe an equivalent logic function, despite the restructuring of the logic circuit 20 of FIG. 2. That is, the logic circuit 30 of FIG. 3 includes two flip-flops/registers in a cycle that originally included only a single flip-flop/register. In addition, no change has been made to the combinational logic in the cycle containing the two registers. This often results in a significant improvement in performance, perhaps by a factor of two, if the cyclic path was limiting the performance of the original logic circuit 10 shown in FIG. 1.

Once the additional register has been introduced, a variety of conventional logic optimizations can be applied to further improve the performance of the system shown in FIG. 3.

For example, the transformation described above is repeatable by including additional registers on path 305 of FIG. 3 and by introducing additional copies of the function f. This is shown by way of example with regard to FIG. 4.

Extended Cyclic Structure Optimization

Figure 4:
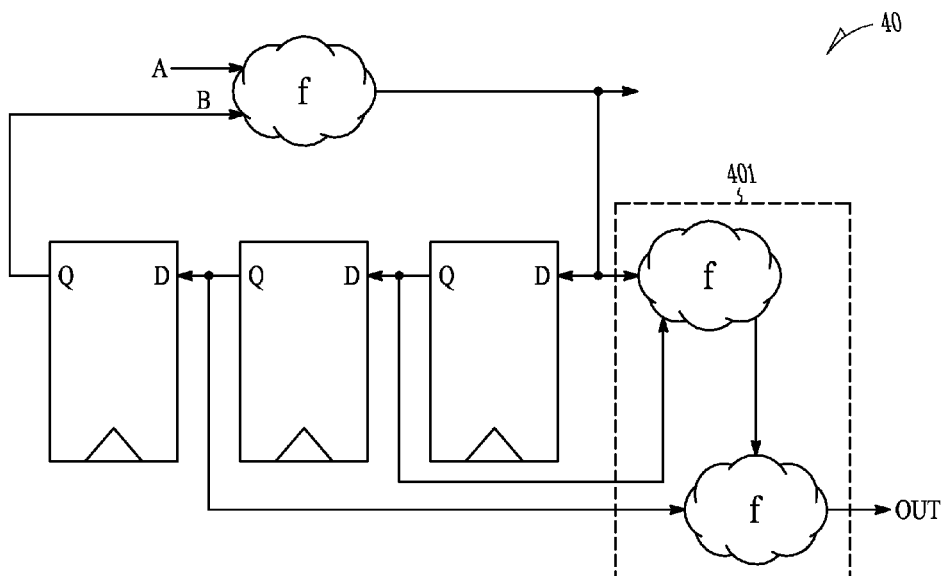
FIG. 4 is an illustration of the logic circuit of FIG. 3 in which the cyclic path includes three flip-flops, according to various embodiments of the invention.

FIG. 4 is an illustration of the logic circuit 30 of FIG. 3 in which the cyclic path includes three flip-flops, according to various embodiments of the invention. The logic circuit 40 of FIG. 4 is therefore provided to illustrate how the improvement of an example cyclic structure may be extended.

Given that the function f is a commutative, associative function, the combinational logic structure 401 can be constructed in a variety of ways, including as the linear structure as shown in FIG. 4. Another way to construct the combinational logic structure 401 is with a tree-structure (not shown). A tree structure, well known to those of ordinary skill in the art, can be advantageous for improving the latency of the system when additional flip-flops are introduced, along with additional copies of function f.

It is noted that the structure 401, including replicas of the function f, is acyclic, and its performance may be optimized using traditional techniques like time borrowing and re-timing. These optimizations will be evident to those having ordinary skill in the art.

To further illustrate how a cyclic structure in synchronous or asynchronous logic may be optimized by re-structuring (i.e., transforming) logic in a manner that improves system performance, it is noted that the re-structuring methods described herein may be applied to the common associative, commutative function of binary addition. This function is often found in designs that contain "accumulate" operators. Commonly used designs that include such accumulate operators include, for example, multiply-accumulate, vector dot product, and matrix multiplication. Other examples of associative, commutative functions with identity to which the methods described herein can be applied include multiplication, AND, OR, and XOR functions.

It should be understood that the circuit shown in FIG. 1 is not to be construed as the only situation in which the transformation described above can be applied. Thus, in general, suppose there is an output signal or a set of output signals out from some complex piece of logic L that includes both combinational logic and state-holding elements. Let all the external inputs for logic L be called I, and all the state-holding elements from logic L be called S. Further, let out be generated as a function f(I;S) of input signals I and state-holding elements S from logic L. Let the logic that updates the state-holding elements S be denoted by g, and the inputs to the state-holding elements be IN. Using the same notation as before, we have the following relationships:

$$out[k]=f(I[k];S[k])$$

$$S[k+1]=IN[k]$$

$$IN[k]=g(I[k];S[k])=g(I[k];g(I[k-1];g(I[k-2]\ldots g(I[0];S[0])\ldots)))$$

If we duplicate every state-holding element in logic L, then it is well known to those having ordinary skill in the art that the resulting new logic L' behaves like two copies of logic L, one operating on inputs that arrive on odd-numbered cycles, and the other operating on inputs arriving on even-numbered cycles. This transformation is sometimes known as 2-slow re-timing, and can be generalized to c-slow re-timing, where c replicas are made of each state-holding element. After c-slow re-timing, the replicas of the state-holding elements S[i] can be denoted by T1[i], ... Tc[i].

The new relationships between the inputs and state-holding elements are then given by:

$$IN[c*k+j]=g(I[c*k+j];g(I[c*(k-1)+j];\ldots g(I[j];Tj[0])\ldots))$$

Finally, because the signal IN is followed by c registers, those registers hold (respectively) IN[c*k+j−1], IN[c*k+j−2], etc. (i.e. the value of IN on the c-previous cycles). If the function g is associative, commutative (i.e. has the same properties as the function f described in some embodiments), we can use g repeatedly to compute the original value out from the values of the registers T1 ... Tc and the primary input I in an analogous manner as before.

Illustrative Non-Optimized Logic Circuit

Figure 5:
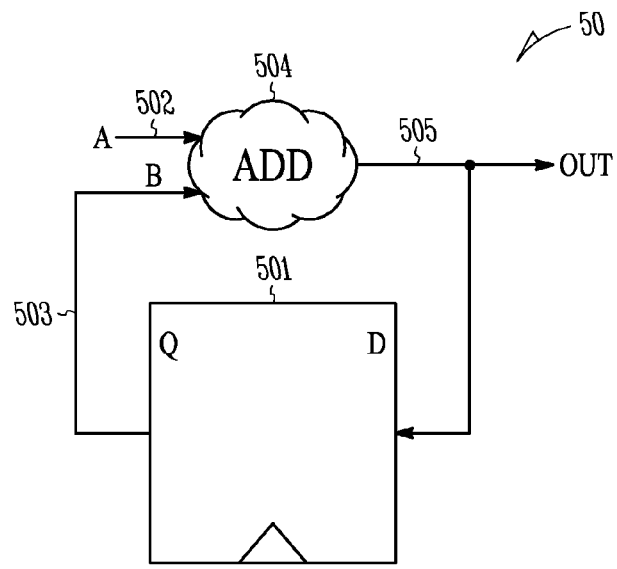
FIG. 5 is an illustration of a particular prior art instance of the logic circuit of FIG. 2 in which the iterative structure is one of binary addition.

FIG. 5 is an illustration of a particular prior art instance 50 of the logic circuit 20 of FIG. 2 in which the iterative structure is one of binary addition. It will be shown that by transforming the binary addition logic circuit 50 of FIG. 5, in accordance with the some of the embodiments described herein, a significant improvement in performance may result, perhaps by a factor of two. Those of ordinary skill in the art will appreciate that while the logic circuit 50 of FIG. 5 illustrates a single iterative (i.e., cyclic) addition structure, it serves as a proxy for an n-bit iterative addition structure wherein the flip-flop (e.g., accumulator) 501 may include n or more flip-flops dependent upon the precision at which the result is accumulated.

Continuing with the explanation of FIG. 5, the binary addition logic circuit 50 of FIG. 5 includes a flip-flop 501 which functions as an accumulator for holding the current value 503 of the sum being computed. As shown, the current value 503 is added to an external input 502 by combinational logic 504 to produce output 505. This output 505 is used as an input to the accumulator 501 to perform an iterative (cyclic) addition operation.

Illustrative Optimized Logic Circuit

An improvement in the performance of synchronous and asynchronous logic in the presence of cyclic structures may be realized by utilizing a carry-save adder (CSA). As is well-known to those of ordinary skill in the art, CSAs are parallel adders that combine three inputs and produce two outputs so that the sum of the inputs is equal to the sum of the outputs. These adders are frequently used in multipliers. A significant benefit of using a CSA device is that the delay through the CSA is constant and independent of the bit-width of its operands.

Figure 6:
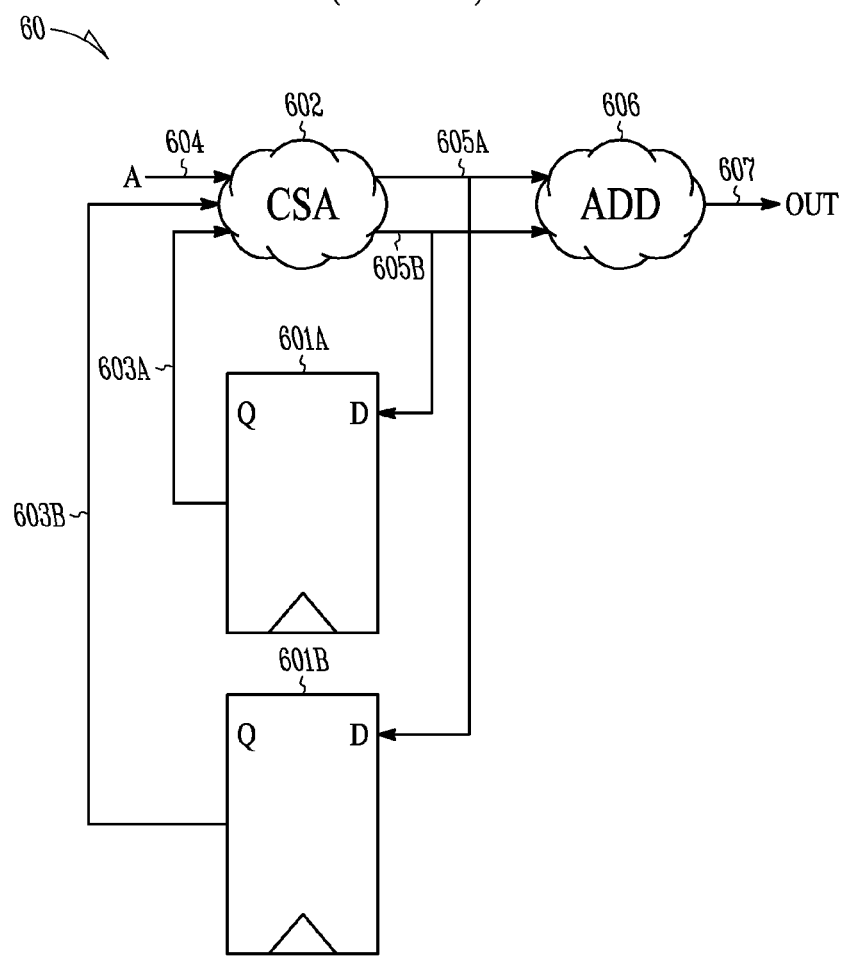
FIG. 6 is an illustration of the logic circuit that is an equivalent implementation of the iterative structure of FIG. 5, according to various embodiments of the invention.

FIG. 6 is an illustration of the logic circuit 60 that is an equivalent implementation of the iterative structure of FIG. 5, according to various embodiments of the invention. Here a CSA 602 has been substituted for the adder 504 of FIG. 5, while the adder itself (now adder 606) has been moved outside of the cyclic structure, while remaining coupled to the output 607. The accumulator 501 of FIG. 5 is replaced with two sets of registers 601a and 601b. These two registers 601A and 601B hold partial sums computed by the carry-save adder CSA 602. The inputs 603A and 603B to the CSA 602 are the outputs of the partial sum registers 601A and 601B, as well as the value 604 that is the primary input accumulated by the logic circuit 60. The outputs 605A and 605B of the CSA 602 are the two inputs to the original adder 606, and the sum is used to produce the primary output 607.

One potential benefit of the logic circuit 60 is that the delay through the adder 606, perhaps representing the dominant delay in the prior art cyclic structure of FIG. 5, has been replaced by the delay through the CSA 602, which may be a significantly lower delay. The logic circuit 60 of FIG. 6 can be further transformed using the novel cyclic structures described herein to provide further performance enhancements.

A set of transformations have been described that can be used to optimize the performance of cyclic structures in synchronous logic. It should be appreciated that the described embodiments make use of registers in feedback paths by way of illustration, and not limitation. That is, the same transformations may be applied to asynchronous logic structures via the introduction of data tokens instead of registers. In this case, the combinational logic is replaced by asynchronous logic that may or may not be pipelined, and the registers replaced by initial locations of data values, or "initial tokens."

Asynchronous logic that is pipelined can operate at very high frequencies. One of the limitations to the throughput of an asynchronous pipeline is the presence of a cycle of pipeline stages. This cycle corresponds to the feedback loop highlighted in the logic structure of FIG. 2. In the asynchronous logic context, the "combinational logic" function "f" is replaced by an asynchronous computation block that computes function "f". The register 103 is replaced with the initial location of the data value being processed by the asynchronous pipeline. This data value being processed is commonly referred to as a "data token."

The throughput of such an asynchronous pipeline that has a cyclic structure is limited by a variety of factors. In a first scenario, if the pipeline has a very small number of pipeline stages in the cycle, then the throughput is limited by the fact that data has no space to move forward. This is referred to as the "hole limited" operating regime, and in this scenario the throughput of the system can be improved by adding pipeline stages that simply propagate data. In a second scenario, a limit occurs when the delay through the logic function "f" is very large, and the throughput of the pipeline is limited by the time it takes the data token to propagate around the cyclic structure.

The transformation described above can also be applied to the second scenario. The application of the transformation introduces two data tokens into the cyclic structure, thereby improving the processing throughput of the asynchronous pipeline. One method to apply the transformation in asynchronous pipelines is by taking the logic structure from FIG. 2 and FIG. 3, and applying a systematic method that converts the synchronous logic to an asynchronous pipeline (e.g., replacing register 103 of FIG. 2 with an initial token). Such a transformation is described in further detail by U.S. Patent Application Publication No. 20070256038, assigned to the assignee of the present disclosure, and incorporated herein by reference in its entirety. A more direct approach is to operate directly on an asynchronous pipeline using the same transformation described above. This corresponds to replicating the token in the loop (analogous to replicating the state-holding element 103 as illustrated in FIG. 3), and also replicating the asynchronous logic (analogous to replicating the synchronous logic 101 as illustrated in FIG. 3). The connectivity between the blocks is the same as in the synchronous case.

Many other embodiments may be realized. For example, some embodiments include methods.

Methods

Figure 7:
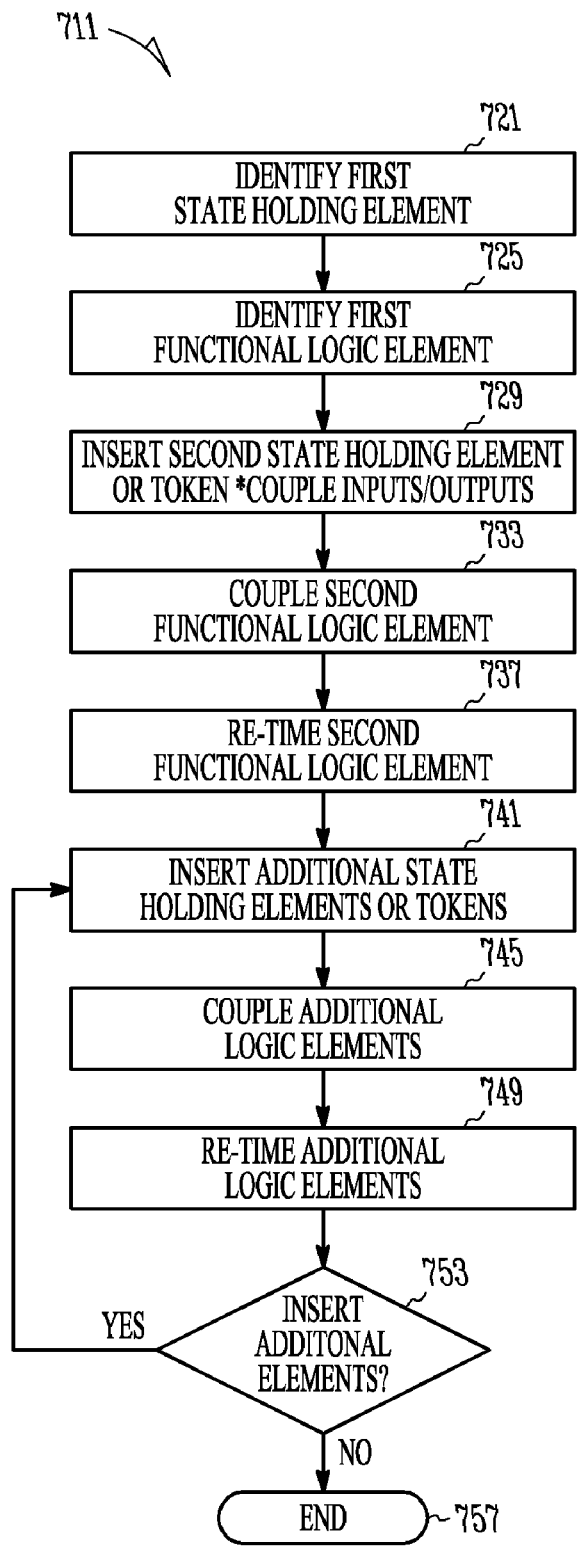
FIG. 7 is a flow diagram illustrating methods according to various embodiments of the invention.

FIG. 7 is a flow diagram illustrating methods 711 according to various embodiments of the invention. For example, a method 711 for improving the performance of synchronous and asynchronous logic in the presence of cyclic structures may comprise identifying a first state holding element in an original cyclic structure at block 721, and identifying a first functional logic element in said original cyclic structure at block 725. The method 711 may continue with inserting a second state holding element or initial token in series with the first functional element in the original cyclic structure to provide a modified cyclic structure at block 729, wherein the second state holding element or initial token has identical functionality to the first state holding element. Inserting at block 729 may comprise coupling an input of said second state holding element or initial token to an output of said first functional element, and coupling an output of said second state holding element or initial token to an input of said first state holding element.

For the purposes of this document, "identical functionality" with respect to tokens or state holding elements means having the same logical functionality, but not necessarily the same performance speed, power consumption, or state holding element initial data values.

The method 711 may go on to include coupling a second functional logic element to an output node of said modified cyclic structure at block 733, wherein said second functional logic element has identical functionality to the first functional logic element. In some embodiments, the method 711 may further include re-timing the modified cyclic structure and/or the second functional logic element to reduce or minimize a cycle period associated with the second functional logic element at block 737.

Additional elements may be inserted and coupled so that other embodiments may be realized. For example, the method 711 may comprise inserting additional holding state elements or initial tokens, such as a third state holding element, in said modified cyclic structure to create a further modified cyclic structure at block 741, wherein the additional state holding elements or tokens have identical functionality to said first and said second state holding elements.

The method 711 may go on to include, at block 745, coupling additional functional logic elements, such as a third functional logic element, to an output node of said second functional element, wherein the additional functional logic elements have identical functionality to said first and said second functional logic elements. In some embodiments, the method 711 includes re-timing the additional functional logic elements to reduce at least one cyclic period associated with the additional functional logic elements (e.g., the third functional logic element) at block 749. If additional elements are to be inserted, as determined at block 753, then the method 711 may continue at block 741. If no additional elements are to be inserted, then the method 711 may terminate at block 757. It should be noted that state holding elements may comprise registers, and that functional logic elements may comprise one or more of an adder, a subtractor, or a multiplier.

Figure 8:
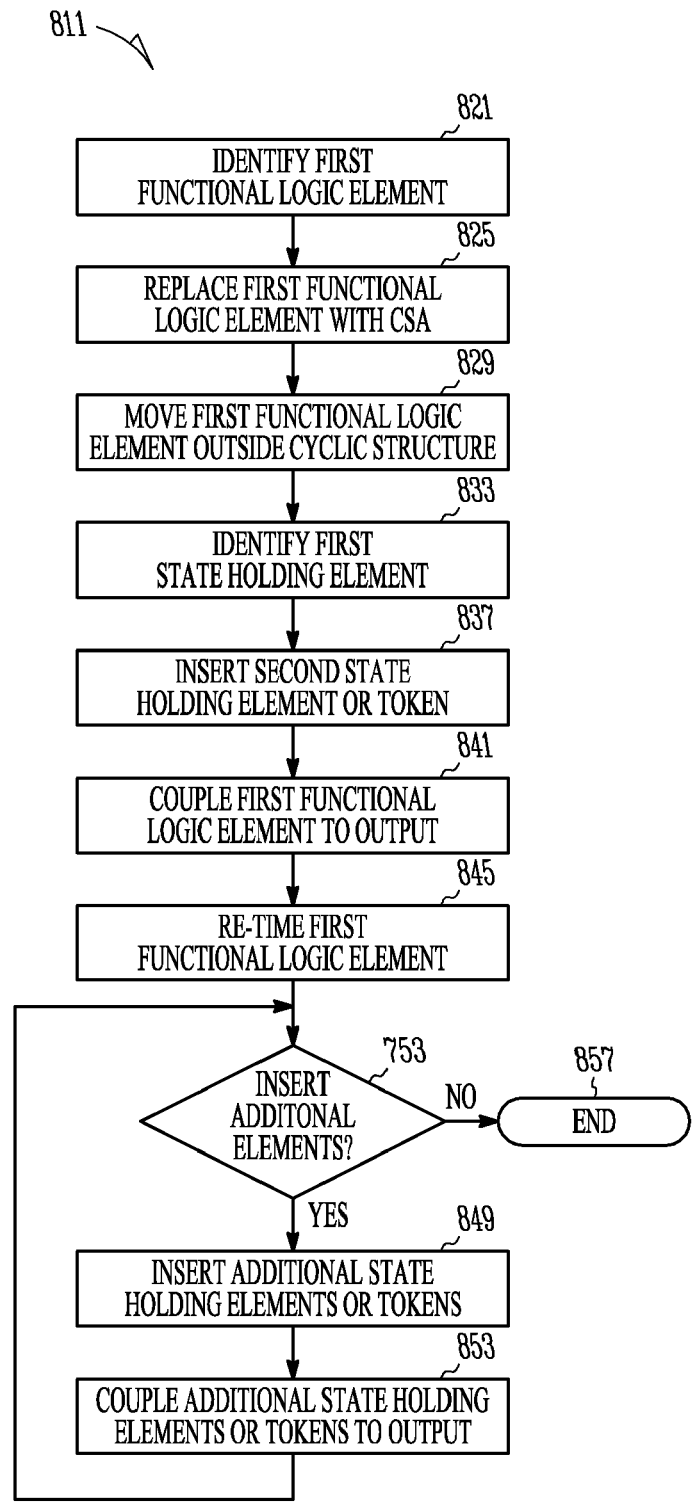
FIG. 8 is a flow diagram illustrating additional methods according to various embodiments of the invention.

FIG. 8 is a flow diagram illustrating additional methods 811 according to various embodiments of the invention. For example, a method of improving the performance of synchronous and asynchronous logic in the presence of cyclic structures may comprise identifying a first functional logic element in said original cyclic structure at block 821, and substituting a CSA for said identified first functional element (e.g., replacing the first functional element with a CSA) in said original cyclic structure to provide a modified cyclic structure at block 825. The method 811 may thus include moving the first functional logic element outside of the original cyclic structure at block 829.

The method 811 may go on to include identifying a first state holding element in said original cyclic structure at block 833, and inserting a second state holding element or initial token in parallel with said first state holding element in said modified cyclic structure at block 837, wherein said second state holding element or initial token has identical functionality to said first state holding element. The method 811 may then go on to include coupling said first functional logic element to an output node of said modified cyclic structure at block 841.

In some embodiments, the method 811 may include re-timing said modified cyclic structure and said first functional logic element to reduce a clock period associated with the first functional logic element at block 845. If it is determined that no additional elements are to be inserted at block 753, then the method may terminate at block 857.

However, if it is determined that additional elements are to be inserted at block 753, then the method 811 may include inserting, at block 849, additional state holding elements or initial tokens, such as a third state holding element, in parallel with said first and said second state holding elements in said modified cyclic structure, wherein the additional state holding elements or initial tokens have identical functionality to said first and said second state holding elements. The method 811 may go on to include coupling additional functional logic elements, such as a second functional logic element, to an output node of the first functional logic element at block 853. The method 811 may then continue on to block 753.

It should be noted that unless specifically claimed otherwise, the methods described herein do not have to be executed in the order described, or in any particular order. Moreover, various activities described with respect to the methods identified herein can be executed in iterative, repetitive, serial, or parallel fashion. Information, including parameters, commands, operands, and other data, can be sent and received in the form of one or more carrier waves.

Figure 9:
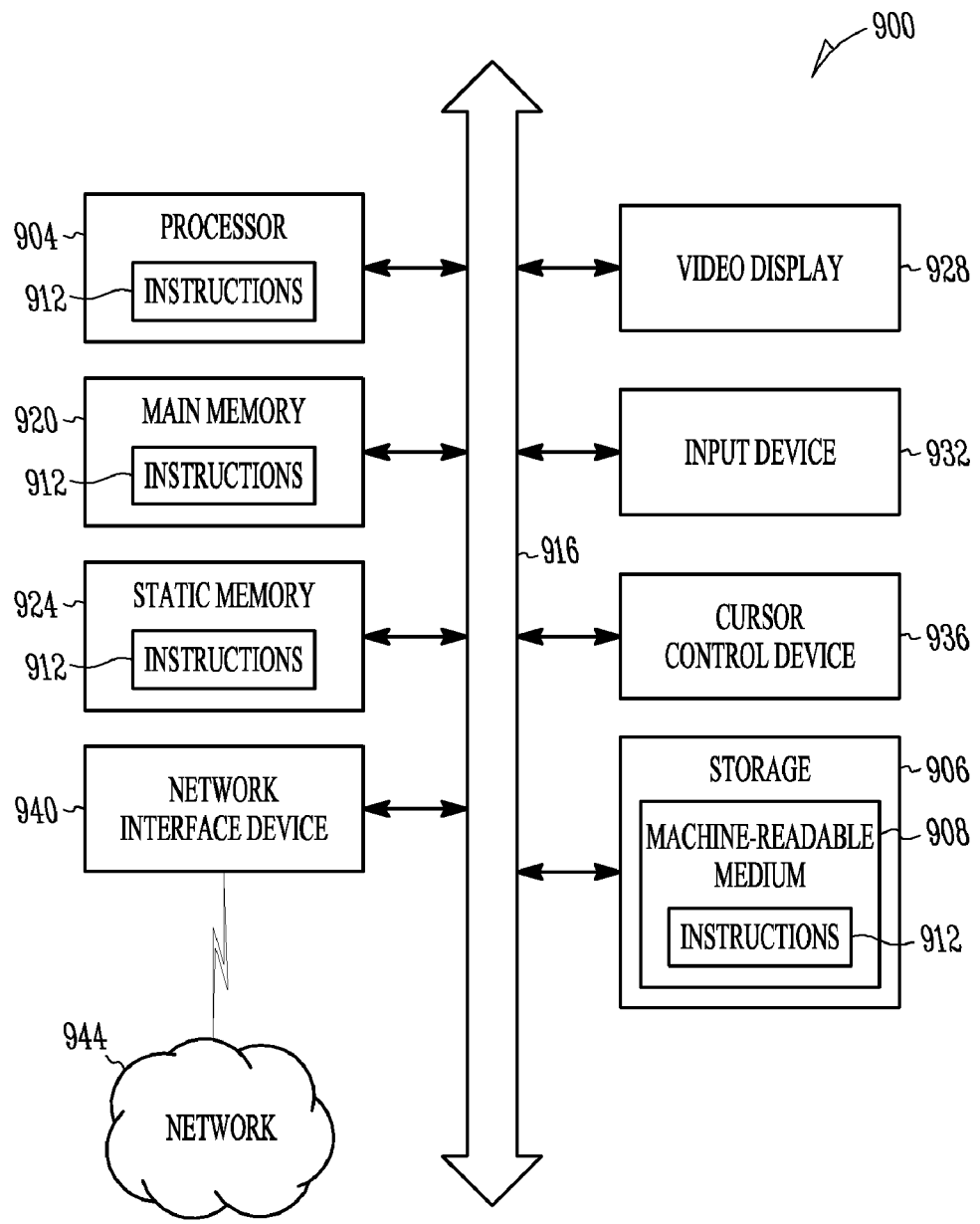
FIG. 9 is a block diagram of an article of manufacture, including a machine, according to various embodiments.

FIG. 9 is a block diagram of an article 900 of manufacture, including a machine 902, according to various embodiments. Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java or C++. Alternatively, the programs can be structured in a procedure-orientated format using a procedural language, such as assembly or C. The software components may communicate using any of a number of mechanisms well known to those of ordinary skill in the art, such as application program interfaces or interprocess communication techniques, including remote procedure calls. The teachings of various embodiments are not limited to any particular programming language or environment.

Thus, other embodiments may be realized. For example, an article of manufacture 900, such as a computer, a memory system, a magnetic or optical disk, some other storage device, and/or any type of electronic device or system may include one or more processors 904 coupled to a machine-readable medium 908 such as a memory (e.g., removable storage media, as well as any memory including an electrical, optical, or electromagnetic conductor) having instructions 912 stored thereon (e.g., computer program instructions), which when executed by the one or more processors 904 result in performing any of the actions described with respect to the methods above.

The machine 902 may take the form of a computer system having a processor 904 coupled to a number of components directly, and/or using a bus 916. Such components may include main memory 920, static or non-volatile memory 924, and mass storage 906. Other components coupled to the processor 904 may include an output device 928, such as a video display, an input device 932, such as a keyboard, and a cursor control device 936, such as a mouse. A network interface device 940 to couple the processor 904 and other components to a network 944 may also be coupled to the bus 916. The instructions 912 may further be transmitted or received over the network 944 via the network interface device 940 utilizing any one of a number of well-known transfer protocols (e.g., HTTP). Any of these elements coupled to the bus 916 may be absent, present singly, or present in plural numbers, depending on the specific embodiment to be realized.

The processor 904, the memories 920, 924, and the storage device 906 may each include instructions 912 which, when executed, cause the machine 902 to perform any one or more of the methods described herein. The input device 932 may be used to select the number of state holding elements inserted into a modified cyclic structure, for example. In alternative embodiments, the machine 902 operates as a standalone device or may be connected (e.g., networked) to other machines. In a networked environment, the machine 902 may operate in the capacity of a server or a client machine in server-client network environment, or as a peer machine in a peer-to-peer (or distributed) network environment. The machine 902 may be a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine 902 is illustrated, the term "machine" shall also be taken to include any collection of machines that individually or jointly execute a set (or multiple sets) of instructions to perform any one or more of the methodologies discussed herein.

While the machine-readable medium 908 is shown as a single medium, the term "machine-readable medium" should be taken to include a single medium or multiple media (e.g., a centralized or distributed database, and/or associated caches and servers, and or a variety of storage media, such as the processor 904 registers, memories 920, 924, and the storage device 906) that store the one or more sets of instructions 912. The term "machine-readable medium" shall also be taken to include any medium that is capable of storing, encoding or carrying a set of instructions for execution by the machine and that cause the machine to perform any one or more of the methodologies of the present invention, or that is capable of storing, encoding or carrying data structures utilized by or associated with such a set of instructions. The term "machine-readable medium" shall accordingly be taken to include, but not be limited to tangible media, such as solid-state memories and optical and magnetic media, and intangible media, such as carrier wave signals.

As noted previously, some embodiments may include a circuit or design stored upon and/or embedded within machine-readable media associated with a design tool used for designing semiconductor devices. Examples include behavioral descriptions, such as a netlist formatted in the VHSIC Hardware Description Language (VHDL) language, Verilog language, or SPICE language. Some netlist examples include: a behavioral level netlist, a register transfer level (RTL) netlist, a gate level netlist and a transistor level netlist. Machine-readable media also include media having layout information, such as a GDS-II file. Furthermore, netlist files or other machine-readable media for semiconductor chip design may be used in a simulation environment to perform any of the activities forming part of the methods described above.

CONCLUSION

Implementing the apparatus, systems, and methods disclosed herein may improve the performance of synchronous and asynchronous logic in the presence of cyclic structures. Utilizing these apparatus, systems, and methods may also serve to reduce the occurrence of undesirable changes in circuit functionality that have heretofore been experienced when other optimization techniques are used.

In this detailed description, reference is made to specific examples by way of drawings and illustrations. These examples are described in sufficient detail to enable those skilled in the art to practice the inventive subject matter, and serve to illustrate how the inventive subject matter can be applied to various purposes or embodiments. Other embodiments are included within the inventive subject matter, as logical, mechanical, electrical, and other changes can be made to the example embodiments described herein. Features or limitations of various embodiments described herein, however essential to the example embodiments in which they are incorporated, do not limit the inventive subject matter as a whole, and any reference to the invention, its elements, operation, and application are not limiting as a whole, but serve only to define these example embodiments.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Description of the Embodiments, it can be seen that various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into this detailed description, with each claim standing on its own as a separate embodiment.

What is claimed is:

1. A method to improve the performance of synchronous and asynchronous logic in the presence of cyclic structures, the method comprising:

identifying, using one or more processors, a first state holding element in an original cyclic structure;

identifying a first functional logic element in said original cyclic structure;

inserting a second state holding element or initial token in series with said first functional logic element in said original cyclic structure to create a modified cyclic structure, wherein said second state holding element or initial token has identical functionality to the first state holding element; and coupling a second functional logic element to an output node of said modified cyclic structure, wherein said second functional logic element has identical functionality to the first functional logic element.

2. The method according to claim 1, wherein the inserting comprises:

coupling an input of said second state holding element or initial token to an output of said first functional element; and coupling an output of said second state holding element or initial token to an input of said first state holding element.

3. The method according to claim 1, further comprising:

re-timing said modified cyclic structure and said second functional logic element to reduce a cyclic period associated with the second functional logic element.

4. The method according to claim 1, further comprising:

inserting a third state holding element or initial token in said modified cyclic structure to create a further modified cyclic structure, wherein said third state holding element or initial token has identical functionality to said first and said second state holding elements; and coupling a third functional logic element to an output node of said second functional element, wherein said third functional logic element has identical functionality to said first and said second functional logic elements.

5. The method according to claim 4, further comprising:

re-timing said third functional logic element to reduce a cyclic period associated with said third functional logic element.

6. The method according to claim 1, wherein said first and second state holding elements comprise registers.

7. The method according to claim 6, wherein said first functional logic element comprises at least one of an adder, a subtractor, or a multiplier.

8. A method for improving the performance of synchronous and asynchronous logic in the presence of cyclic structures, the method comprising:
identifying a first functional logic element in said original cyclic structure;
substituting a carry-save-adder (CSA) for said identified first functional logic element in said original cyclic structure to provide a modified cyclic structure;
identifying, using one or more processors, a first state holding element in said original cyclic structure;
inserting a second state holding element or initial token in parallel with said first state holding element in said modified cyclic structure, wherein said second state holding element or initial token has identical functionality to said first state holding element; and
coupling said first functional logic element to an output node of said modified cyclic structure.

9. The method according to claim 8, further comprising:
re-timing said modified cyclic structure and said first functional logic element to reduce a clock period associated with the first functional logic element.

10. The method according to claim 8, wherein the first functional logic element comprises an adder.

11. The method according to claim 8, wherein said first and second state holding elements comprise registers.

12. The method according to claim 8, further comprising:
inserting a third state holding element or initial token in parallel with said first and said second state holding elements in said modified cyclic structure, wherein said third state holding element or initial token has identical functionality to said first and said second state holding elements; and
coupling a second functional logic element to an output node of said first functional logic element.

13. The method according to claim 12, wherein the second functional element comprises an adder.

14. The method according to claim 8, wherein said third state holding element comprises a register.

15. A non-transitory machine-readable storage medium storing instructions, which when executed by one or more processors, cause the one or more processors to perform operations comprising:
identifying, using the one or more processors, a first state holding element in an original cyclic structure;
identifying a first functional logic element in said original cyclic structure;
inserting a second state holding element or initial token in series with said first functional logic element in said original cyclic structure to create a modified cyclic structure, wherein said second state holding element or initial token has identical functionality to the first state holding element; and
coupling a second functional logic element to an output node of said modified cyclic structure, wherein said second functional logic element has identical functionality to the first functional logic element.

16. The non-transitory machine-readable storage medium of claim 15, wherein the instructions, when executed by one or more processors, cause the one or more processors to perform operations comprising:
inserting additional state holding elements or initial tokens in said modified cyclic structure to create a further modified cyclic structure, wherein said additional state holding elements or initial tokens have identical functionality to said first and said second state holding elements; and
coupling additional functional logic elements to an output node of said second functional logic element or initial token, wherein said additional functional logic elements have identical functionality to said first and said second functional logic elements.

17. The non-transitory machine-readable storage medium of claim 16, wherein the instructions, when executed by one or more processors, cause the one or more processors to perform operations comprising:
re-timing said additional functional logic elements to reduce at least one cyclic period associated with said additional functional logic elements.

18. The non-transitory machine-readable storage medium of claim 15, wherein the machine-readable medium further comprises:
a behavioral level description of the modified cyclic structure.

19. The non-transitory machine-readable storage medium of claim 18, wherein the behavioral level description comprises:
a netlist.

20. A non-transitory machine-readable storage medium storing instructions, which when executed by one or more processors, cause the one or more processors to perform operations comprising:
identifying a first functional logic element in said original cyclic structure;
substituting a carry-save-adder (CSA) for said identified first functional logic element in said original cyclic structure to provide a modified cyclic structure;
identifying, using the one or more processors, a first state holding element in said original cyclic structure;
inserting a second state holding element or initial token in parallel with said first state holding element in said modified cyclic structure, wherein said second state holding element or initial token has identical functionality to said first state holding element; and
coupling said first functional logic element to an output node of said modified cyclic structure.

21. The non-transitory machine-readable storage medium of claim 20, wherein the instructions, when executed by one or more processors, cause the one or more processors to perform operations comprising:
inserting additional state holding elements or initial tokens in parallel with said first and said second state holding elements in said modified cyclic structure, wherein said additional state holding elements or initial tokens have identical functionality to said first and said second state holding elements; and
coupling additional functional logic elements to an output node of said first functional logic element.

22. The non-transitory machine-readable storage medium of claim 21, wherein the instructions, when executed by one or more processors, cause the one or more processors to perform operations comprising:
re-timing said additional functional logic elements to reduce at least one cyclic period associated with said additional functional logic elements.

23. A method, comprising:
identifying a first asynchronous computation block forming part of an original cyclic structure;
identifying, using one or more processors, a first data token element in said original cyclic structure;

inserting a second data token element in series with said first data token element in said original cyclic structure to create a modified cyclic structure, wherein said second data token element has identical functionality to the first data token element; and coupling a second asynchronous computation block to an output node of said modified cyclic structure, wherein said second asynchronous computation block has identical functionality to the first asynchronous computation block.

24. The method of claim 23, wherein the first and the second asynchronous computation blocks comprise asynchronous pipelines.

25. The method of claim 23, comprising:

inserting additional data tokens in the modified cyclic structure; and coupling additional asynchronous computation blocks to the modified cyclic structure.

26. A system, comprising:

a memory having instructions stored therein;

a processor to execute the instructions, wherein the instructions result in identifying a first state holding element in an original cyclic structure, identifying a first functional logic element in said original cyclic structure, inserting a second state holding element or initial token in series with said first functional logic element in said original cyclic structure to create a modified cyclic structure, wherein said second state holding element or initial token has identical functionality to the first state holding element, and coupling a second functional logic element to an output node of said modified cyclic structure, wherein said second functional logic element has identical functionality to the first functional logic element; and a display to display the original cyclic structure and the modified cyclic structure.

27. The system of claim 26, comprising:

a storage device to couple to the processor and to store the modified cyclic structure.

28. The system of claim 26, comprising;

an input device to select a number of state holding elements or initial tokens to insert into the modified cyclic structure.

29. The system of claim 26, wherein the inserting comprises connecting an input of said second state holding element or initial token to an output of said first state holding element and connecting an output of said second state holding element or initial token to an input of said first functional element.

* * * * *